(12) United States Patent
De Jesus et al.

(10) Patent No.: US 12,200,890 B2
(45) Date of Patent: Jan. 14, 2025

(54) SUPPLEMENTAL COMPONENT MOUNTING PLATFORM FOR EQUIPMENT RACK

(71) Applicant: VERTIV IT SYSTEMS, INC., Huntsville, AL (US)

(72) Inventors: Christopher A. De Jesus, Huntsville, AL (US); Christopher Wood, Madison, AL (US); Aman Khan, Bethel, CT (US)

(73) Assignee: VERTIV IT SYSTEMS, INC., Huntsville, AL (US)

( * ) Notice: Subject to any disclaimer, the term of this patent is extended or adjusted under 35 U.S.C. 154(b) by 188 days.

(21) Appl. No.: 17/734,054

(22) Filed: Apr. 30, 2022

(65) Prior Publication Data
US 2022/0361354 A1 Nov. 10, 2022

Related U.S. Application Data

(60) Provisional application No. 63/186,612, filed on May 10, 2021.

(51) Int. Cl.
*H05K 7/14* (2006.01)
(52) U.S. Cl.
CPC .................. *H05K 7/14* (2013.01)
(58) Field of Classification Search
None
See application file for complete search history.

(56) References Cited

U.S. PATENT DOCUMENTS

| 9,750,157 B1 | 8/2017 | Mehta | |
| 2001/0026436 A1* | 10/2001 | Tanzer | H01R 25/006 |
| | | | 361/725 |

(Continued)

FOREIGN PATENT DOCUMENTS

| KR | 1020140126558 | 10/2014 |
| KR | 1020150049607 | 5/2015 |

OTHER PUBLICATIONS

International Search Report and Written Opinion in corresponding International application No. PCT/US2022/028306 mailed Aug. 26, 2022, 16 pages.

(Continued)

*Primary Examiner* — James Wu
*Assistant Examiner* — Christopher L Augustin
(74) *Attorney, Agent, or Firm* — HARNESS, DICKEY & PIERCE, P.L.C.

(57) ABSTRACT

The present disclosure relates to a mounting platform for use in an equipment rack having a frame with a pair of spaced apart vertical frame elements. The mounting platform supports at least one external device adjacent a rear area of the equipment rack without interfering with use of internal device mounting locations within the equipment rack. The mounting platform makes use of a gate panel which is configured to support the external device thereon. At least one hinge is used to support the gate panel in a vertical orientation from one of the vertical frame elements. The gate panel is movable between a closed position and an open position. In the closed position the gate panel is positioned parallel to a line extending between the vertical frame elements and supports the external device adjacent to the rear area of the equipment rack. In the open position the gate panel is positioned substantially perpendicular to the line extending between the vertical frame elements, and does not impede access to the internal device mounting locations within the equipment rack.

21 Claims, 8 Drawing Sheets

(56) References Cited

U.S. PATENT DOCUMENTS

| | | | |
|---|---|---|---|
| 2008/0062655 A1* | 3/2008 | Laursen | H04Q 1/09 |
| | | | 361/733 |
| 2008/0123284 A1 | 5/2008 | Jaramillo et al. | |
| 2008/0176445 A1* | 7/2008 | Shifris | H01R 9/2416 |
| | | | 439/540.1 |
| 2016/0224058 A1* | 8/2016 | Ecker | G06F 3/0227 |
| 2018/0070470 A1 | 3/2018 | Anderson et al. | |
| 2019/0069434 A1 | 2/2019 | Aoki | |

OTHER PUBLICATIONS

Extended European Patent Search Report in corresponding EP Application No. 22808119.6 mailed Nov. 18, 2024.

* cited by examiner

SUPPLEMENTAL COMPONENT MOUNTING PLATFORM FOR EQUIPMENT RACK

CROSS REFERENCE TO RELATED APPLICATIONS

The present application claims priority from U.S. provisional application Ser. No. 63/186,612, filed May 10, 2021, the disclosure of which is hereby incorporated by reference into the present disclosure.

FIELD

The present disclosure relates to equipment racks, and more particularly to an equipment rack that incorporates at least one supplemental component mounting platform to enable a component to be mounted within the rack, and accessed, without consuming one of the predefined shelf locations of the rack.

BACKGROUND

The statements in this section merely provide background information related to the present disclosure and may not constitute prior art.

Equipment racks are widely used in both large and small data center settings to house various types of data center components such as servers, network routers, network switches, power distribution units and a wide range of other data center components. Equipment racks have become standardized such that each shelf location in a present day equipment rack defines a "1 U" shelf location. A 1 U shelf location has a height of 1.75 inches (44.45 mm) and a width of 19.0 inches (482.6 mm). A standard equipment rack typically incorporates 42 1 U shelf locations (typically referred to as a "42 U equipment rack"), stands about 78.74 inches (2000 mm) tall and has a footprint of about 31.5 inches (800 mm)×39.4 inches (1000 mm). Some data center components intended for rack mounting have a height greater than 1 U, and therefore the shelf members defining each 1 U shelf location are removable to accommodate such components.

It will be appreciated then that each equipment rack consumes a fair amount of floor space in a data center. There is a strong interest in optimizing the use of each equipment rack so that the 1 U shelf locations in each rack can be used, to the maximum extent possible, for revenue generating components (e.g., servers). At the present time, however, smaller data center components (e.g., IPUs, power bricks, adapter modules, and other like products) which may not require the full space of a 1 U shelf location, still must be mounted in a 1 U mounting location, as no other means is provided in a standard equipment rack for any alternative mounting of such smaller data center components.

SUMMARY

This section provides a general summary of the disclosure, and is not a comprehensive disclosure of its full scope or all of its features.

In one aspect the present disclosure relates to a mounting platform for use in an equipment rack, where the equipment rack has a frame with a pair of spaced apart vertical frame elements. The mounting platform is adapted to support at least one external device adjacent a rear area of the equipment rack without interfering with use of internal device mounting locations within the equipment rack. The mounting platform comprises a gate panel configured to support the at least one external device thereon, and a hinge. The hinge has a first portion and a second portion, and a pin coupling the first and second portions for pivotal movement relative to each other. The second portion is coupled to the gate panel and the first portion is coupled to a respective one of the vertical frame elements. The hinge is further configured to support the gate panel in a vertical orientation from the respective one of the vertical frame elements, and to enable movement of the gate panel between a closed position and an open position. In the closed position, the gate panel is positioned parallel to a line extending between the vertical frame elements and supports the at least one external device adjacent to the rear area of the equipment rack. In the open position, the gate panel is positioned substantially perpendicular to the line extending between the vertical frame elements and does not impede access to the internal device mounting locations within the equipment rack.

In another aspect the present disclosure relates to a mounting platform for use in an equipment rack, where the equipment rack has a frame with a pair of spaced apart vertical frame elements. The mounting platform is adapted to support at least one external device adjacent a rear area of the equipment rack without interfering with use of internal device mounting locations within the equipment rack. The mounting platform comprises a gate panel configured to support the at least one external device thereon, and first and second hinges. Each one of the first and second hinges has a first portion and a second portion, as well as a pin coupling the first and second portions for pivotal movement relative to each other. The second portion is coupled to the gate panel and the first portion is coupled to a respective one of the vertical frame elements. First and second pairs of mushroom-like studs are secured to the gate panel and in accordance with a spacing larger than a lateral dimension of the external device. A pair of toolless snap latches is included, with each one of the pair having a plurality of keyhole-like openings for engaging with a respective one of the first or second pairs of mushroom-like studs. The toolless snap latches can thus be secured to the gate panel without the need for an external tool. The toolless snap latches are further configured to enable mounting of the external device to the gate panel, and removal of the external device form the gate panel, without the need for a hand tool. The first and second hinges are further configured to support the gate panel in a vertical orientation from the respective one of the vertical frame elements, and to enable movement of the gate panel between a closed position and an open position. In the closed position, the gate panel is positioned parallel to a line extending between the vertical frame elements and supports the at least one external device adjacent to the rear area of the equipment rack. In the open position, the gate panel is positioned substantially perpendicular to the line extending between the vertical frame elements and does not impede access to the internal device mounting locations within the equipment rack.

In still another aspect the present disclosure relates to a method for supporting at least one external device adjacent a rear area of an equipment rack without interfering with use of internal device mounting locations within the equipment rack. The equipment rack has a pair of spaced apart vertical frame elements forming a portion of a frame of the equipment rack. The method comprises pivotally supporting a gate panel in a vertical orientation from one of the vertical frame elements such that the gate panel is movable into a closed position arranged parallel to a line extending between the vertical frame elements. In the closed position, the gate panel is positioned at the rear area of the equipment rack adjacent the internal device mounting locations, but without impeding use of the internal device mounting locations. The gate panel is also movable from the closed position into an open position arranged perpendicular to the line extending between the vertical frame elements, and thus is spaced away from the internal device mounting locations. The open position permits unimpeded access to an interior area of the equipment rack. The method further involves using the gate panel to removably support thereon the at least one external device.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
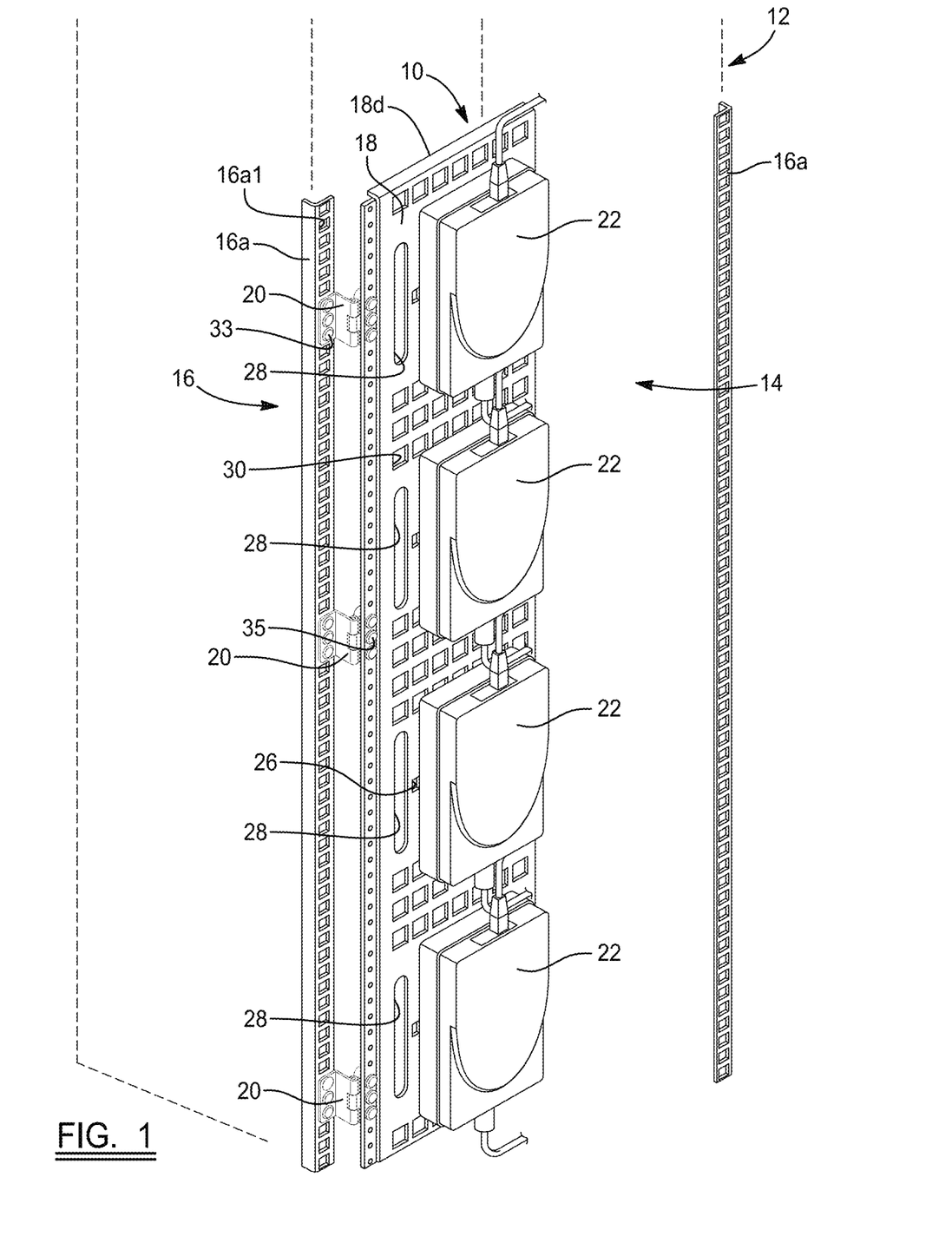
FIG. 1 is a perspective view of one embodiment of a supplemental component mounting platform secured within a rear area of a standard equipment rack, in accordance with the present disclosure.
Figure 1A:
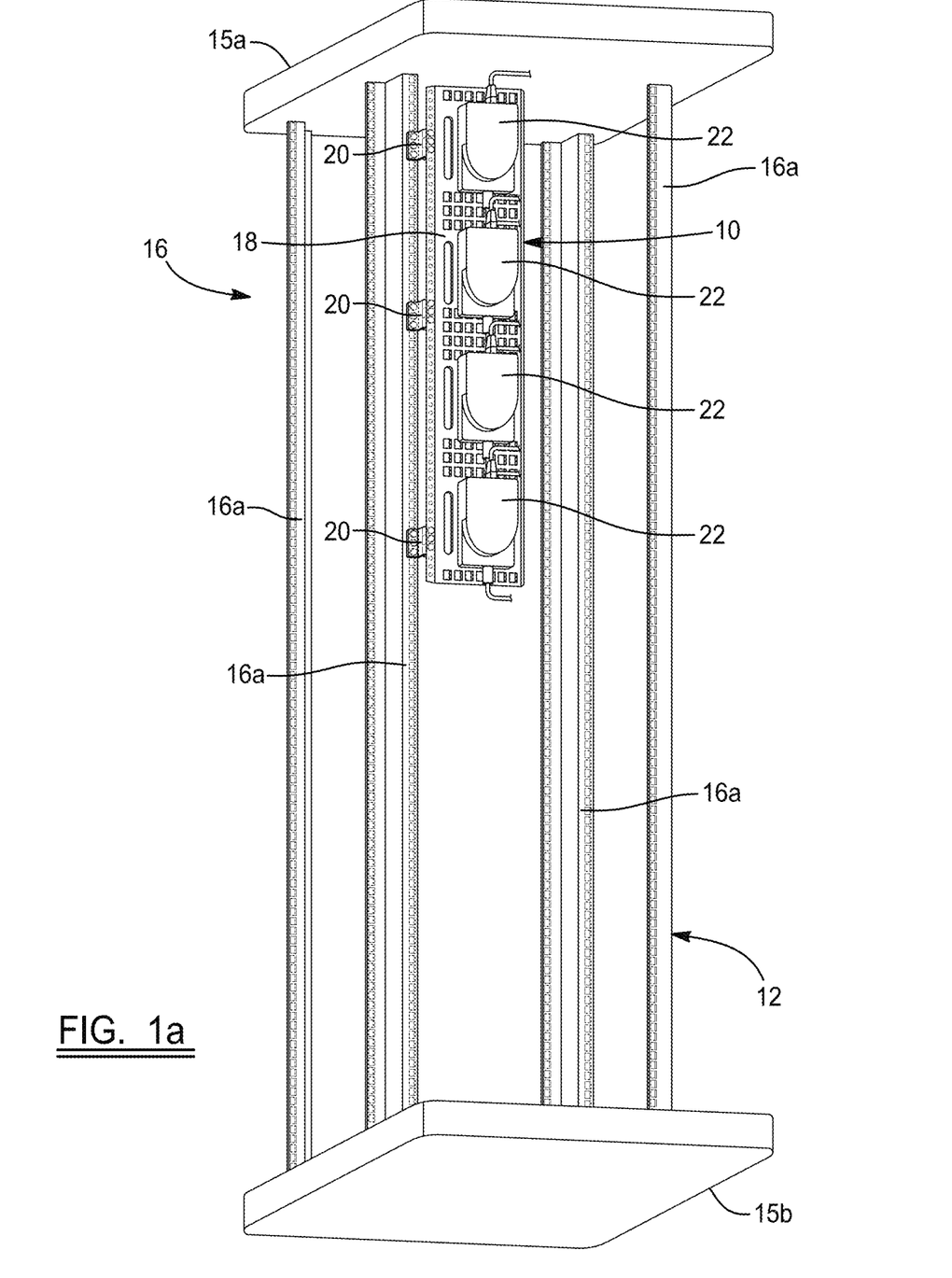
FIG. 1*a* is a perspective view, somewhat similar to FIG. 1, of the supplemental mounting component platform but showing all four vertical frame rails along with top and bottom wall portions of the equipment cabinet.

Referring to FIGS. 1 and 1*a*, a supplemental component mounting platform 10 (hereinafter simply "mounting platform 10") is shown secured within a rear area 14 of a standardized equipment rack 12. The equipment rack 12 in this example is a standard 42 U equipment rack having a plurality of elevationally spaced apart device mounting locations for supporting devices, for example information technology (IT) devices (e.g., servers), thereat. The equipment rack 12 incorporates pairs of spaced apart vertical frame elements 16*a* that help define an overall internal frame structure 16 of the equipment rack. FIG. 1*a* also shows an upper cabinet wall portion 15*a* and a lower cabinet wall portion 15*b* for helping to support the vertical frame elements 16*a* stationary, and parallel to one another.

The mounting platform 10 in this embodiment includes a gate panel 18 and at least one hinge 20, and more preferably at least a pair of hinges 20, which support the gate panel from the vertical frame elements 16*a*. The gate panel 18 is configured to removably support at least one, and more preferably a plurality of, IT devices 22 in a vertical orientation. Once mounted and moved to a closed position as shown in FIGS. 1 and 1*a*, the gate panel 18 rests within the rear area 14 of the equipment rack 12 such that a rear panel or door (not shown) may be attached or closed. Advantageously, the overall footprint of the equipment rack 12 is not increased, while still enabling supporting a plurality of additional IT devices in a manner which does not interfere with use, insertion or removal of other components supported on the 1 U locations of the equipment rack.

In the present example, the IT devices 22 are shown as Avocent® ADX IPUHD devices available from Vertiv™, the assignee of the present disclosure. However, a wide range of other small computing or IT devices such as, without limitation, KVM switches, interface adapters and sensors may also be supported on the gate panel 18. Essentially, any device having a thickness sufficiently small and relatively light in weight such that it can be positioned on the gate panel 18 may potentially be mounted and supported on the gate panel. Thus, relatively thin components (i.e., components typically less than about 1.65 inches (41.9 mm) in thickness), even though traditionally mounted in a horizontal orientation on a 1 U shelf location, may potentially be mounted and supported on the gate panel 18.

Figure 2:
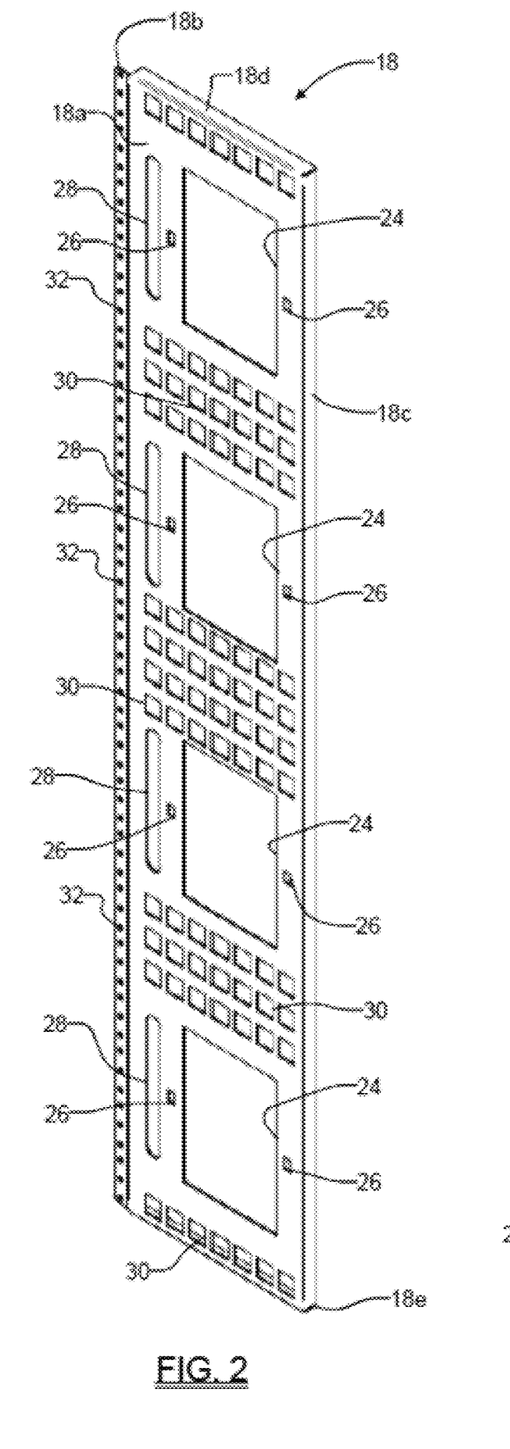
FIG. 2 is a perspective view of just the gate panel of FIG. 1.
Figure 3:
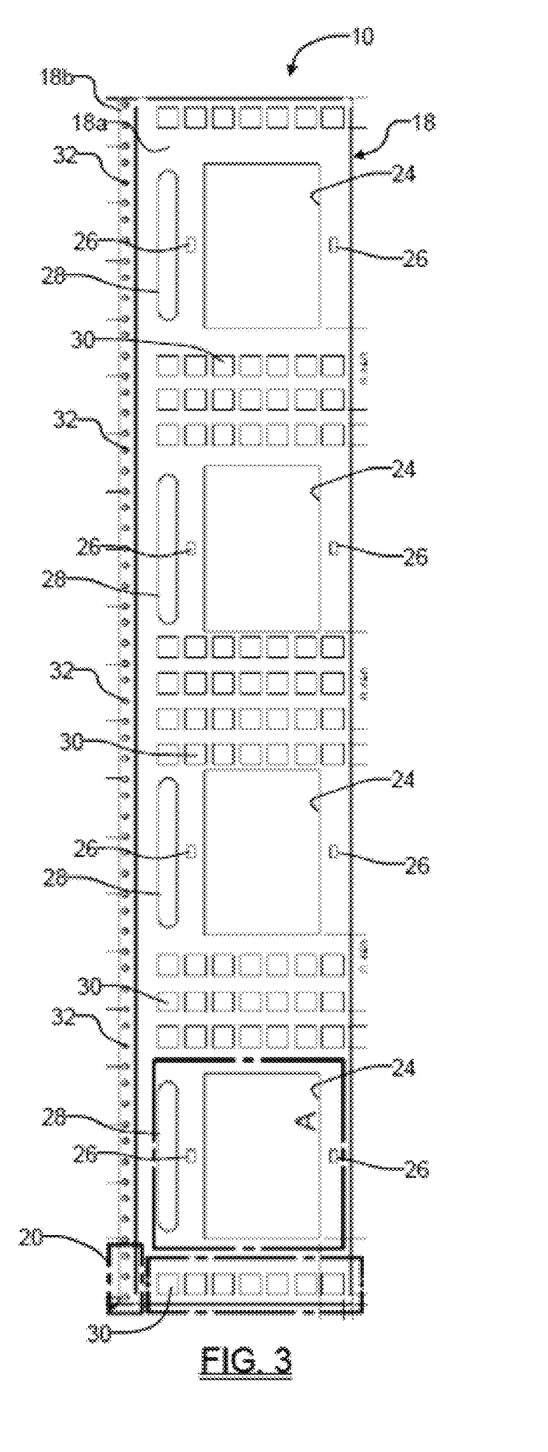
FIG. 3 is a front view of the gate panel of FIG. 2.
Figure 4:
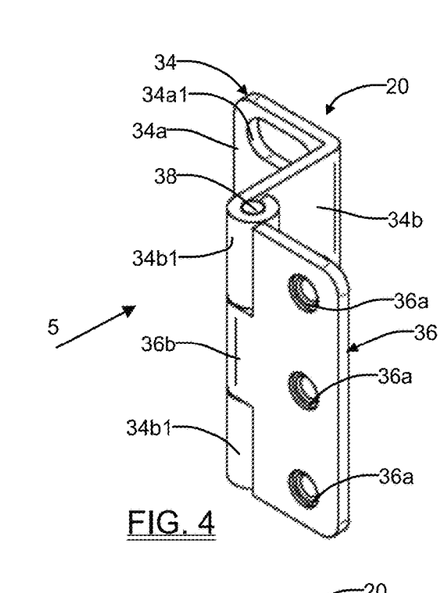
FIG. 4 is a perspective view of one of the hinges shown in FIG. 1.
Figure 5:
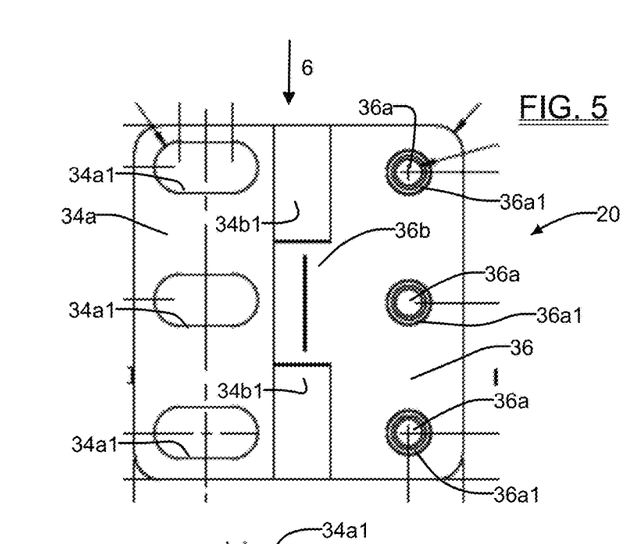
FIG. 5 is a front view of the hinge taken in accordance with directional arrow 5 in FIG. 4.
Figure 6:
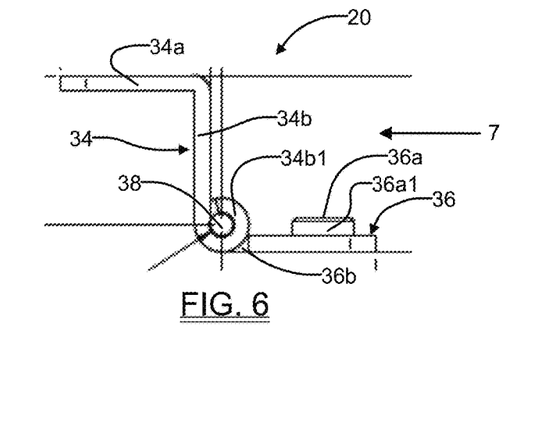
FIG. 6 is a top plan view of the hinge taken in accordance with directional arrow 6 in FIG. 5.
Figure 7:
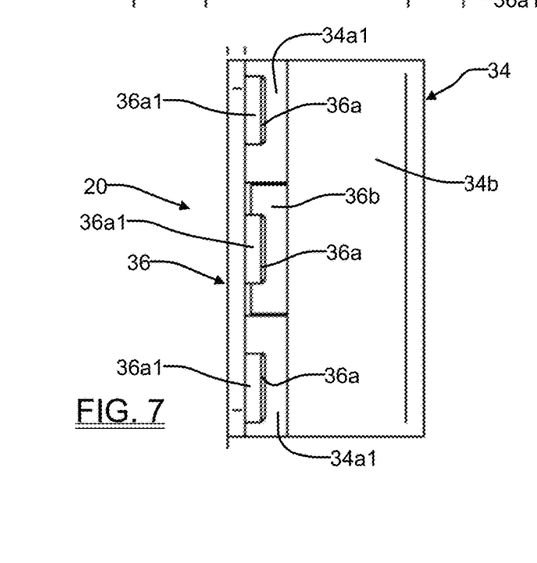
FIG. 7 is a side view of the hinge taken in accordance with directional line 7 shown in FIG. 6.

FIGS. 2 and 3 illustrate just the gate panel 18 shown in FIG. 1 without the IT devices 22. The gate panel 18 includes a main portion 18*a* and a laterally projecting flange portion 18*b*. The main portion 18*a* has one or more spaced apart device openings 24, with each device opening having at least one securing opening 26, and more preferably a pair of securing openings 26 formed adjacent thereto. The device openings 24 may be dimensioned and shaped as needed to accommodate partial or full insertion of the IT devices 22 being mounted. The securing openings 26 enable wire ties or other like implements to be inserted through the securing openings in the main portion 18*a* of the gate panel 18 and used to secure the IT devices 22 within their respective device openings 24. In this manner, if the IT devices 22 have airflow openings in their housings, cooling air flowing through the equipment rack 12 is able to enter and help cool the IT devices 22. An elongated cable opening 28 may be included adjacent where each of the IT devices 22 is mounted to facilitate coupling of electrical cables to the IT devices to enable the IT devices to communicate with other devices mounted in the equipment rack 12, or possibly with other devices and subsystems external to the equipment rack. While only one elongated cable opening 28 is shown adjacent to each device opening 24, potentially two or more such elongated cable openings may be formed around the perimeter of the device opening if desired. The specific types of IT devices 22 being mounted may dictate at least in part how many elongated cable openings 28 should be included around each device opening 24. And while the elongated cable openings 28 are shown in this example with an elongated shape, other shapes (e.g., rectangular, circular, etc.) could just as readily be used.

FIGS. 2 and 3 also show the main portion 18a of the gate panel 18 incorporating a plurality of airflow openings 30. The airflow openings 30 help to facilitate the flow of cooling air through the equipment cabinet 12. While the airflow openings 30 are shown as having a square shape, virtually any shape of opening (e.g., round, rectangular, diamond, etc.) may be used. The airflow openings 30 provide the additional benefit of significantly lightening the weight of the gate panel 18, thus making the gate panel 18 easier to handle during installation, as well as helping to facilitate easy opening and closing movements of the gate panel.

Referring to FIGS. 1-3, the flange portion 18b of the gate panel 18 also includes a plurality of spaced apart hinge mounting holes 32. The hinge mounting holes 32 are shown as having a round shape, but other shapes (square, oblong, etc.) may potentially be used. The hinge mounting holes 32 enable selective attachment of one or more of the hinges 20 (shown only in diagrammatic form in FIG. 3) to be effected with conventional threaded fasteners. The hinges 20 enable opening and closing movements of the gate panel 18. When moved into the fully open position, the gate panel 18 projects outwardly from the rear area 14 of the equipment rack 12 and enables access to the rear areas of the components mounted at the 1 U shelf locations within the equipment rack. This enables quick access to the rear areas of all of the components mounted in the equipment rack 12. When in the fully closed position shown in FIG. 1, the gate panel 18 rests closely adjacent the rear portions of the other components mounted at the 1 U shelf locations but does not interfere with the electrical cabling connected to the other devices or the other devices themselves. Importantly, then, the gate panel 18 does not need to be physically removed from the frame 16 of the equipment rack 12 to enable installation or removal of either the IT devices 22 or the other devices supported at the 1 U shelf locations within the equipment rack.

As visible in FIG. 2, the gate panel 18 may also include optional elements such as a vertical flange 18c, and horizontal top and bottom flanges 18d and 18e. While not absolutely essential, the flanges 18c-18e help to provide significant rigidity and stiffness to the gate panel 18, without adding significant additional weight. This helps improve the overall strength of the gate panel 18 and further helps to fully or substantially eliminate flexing of the gate panel while handling it during installation, as well as when moving it during opening and closing movements. The gate panel 18 may be made from, for example, coated sheet steel (e.g., galvanized sheet steel), aluminum, or any other suitably strong, lightweight material. The thickness of the material used to form the gate panel 18 may also vary considerably to meet the needs of a specific application, but in one embodiment coated sheet steel having a thickness of about 0.79" (2 mm) may be used to form the gate panel 18.

Referring briefly to FIGS. 4-7, one embodiment of the hinge 20 is shown. The hinge 20 differs from many conventional door hinges that make use of two flat hinge plates, in that it includes an angled hinge plate 34 and a flat hinge plate 36. The angled hinge plate 34 includes a first portion 34a and a second portion 34b arranged perpendicularly to the first portion 34a. The first portion 34a includes at least one elongated slot 34a1, but more preferably a plurality of elongated slots 34a1, as visible in FIG. 5. The second portion 34b includes a plurality of pin receiving portions 34b1 which form aligned round bores for receiving a conventional hinge pin 38. The first portion 34a may be secured to a corresponding one of the vertical frame elements 16a using conventional threaded fasteners 33 (visible in FIG. 1) placed through the elongated slots 34a1 in the first portion 34a, and through square shaped holes 16a1 (visible in FIG. 1) in the corresponding one of the vertical frame elements 16a. The elongated nature of the slots 34a1 enables a degree of adjustable lateral positioning of the gate panel 18 at its upper, central and lower areas to help level the gate panel 18 to ensure smooth opening and closing movements. The adjustability provided by the elongated slots 34a1 also may be important if two opposing gate panels 18 are installed in the equipment rack 12, as will be discussed further in the following paragraphs.

The flat hinge plate 36 includes a plurality of holes 36a which communicate with bosses 36a1 (best visible in FIGS. 6 and 7), and a hinge receiving portion 36b. The hinge receiving portion 36b is dimensioned to be received between the pin receiving portions 34b1 and forms an elongated bore of the same diameter as the bores formed by the pin receiving portions 34b1. The bosses 36a1 are internally threaded and have an outer diameter that is selected to enable them to seat within aligned ones of the holes 32 (FIGS. 2 and 3) in the flange portion 18b of the gate panel 18, and to be fastened thereto using conventional threaded fasteners 35 (visible in FIG. 1) during installation of the gate panel. The angled hinge plate 34 and the flat hinge plate 36 are coupled for pivoting movement by the hinge pin 38. The hinge pin 38 extends through the pin receiving portions 34b1 and the hinge receiving portion 36b in conventional fashion. The angled feature of the angled hinge plate 34a serves to offset the gate panel 18 rearwardly from the vertical frame elements 16a when the gate panel 18 is in a fully closed position, which ensures sufficient clearance from the rear portions of the components supported on the 1 U shelf locations of the equipment cabinet 20.

It will be appreciated that the overall dimensions of the hinge 20, the material the hinge 20 is made from, the number of elongated slots 34a1 and holes 36a, and the dimensions of the elongated slots and holes, may all be influenced by the expected overall weight of the gate panel 18 when it is fully loaded with the IT devices 22. In one preferred implementation the hinge 20 may be made from coated sheet steel, although other suitably strong and lightweight materials (e.g., aluminum) may be used as well. In one embodiment the hinge 20 may have a height of 1 U (i.e., 1.75"), although other embodiments may use a greater or lesser height for the hinge. While three hinges 20 are shown in FIG. 1 supporting the gate panel 18, in some embodiments two, four or more hinges 20 may be used.

Figure 8:
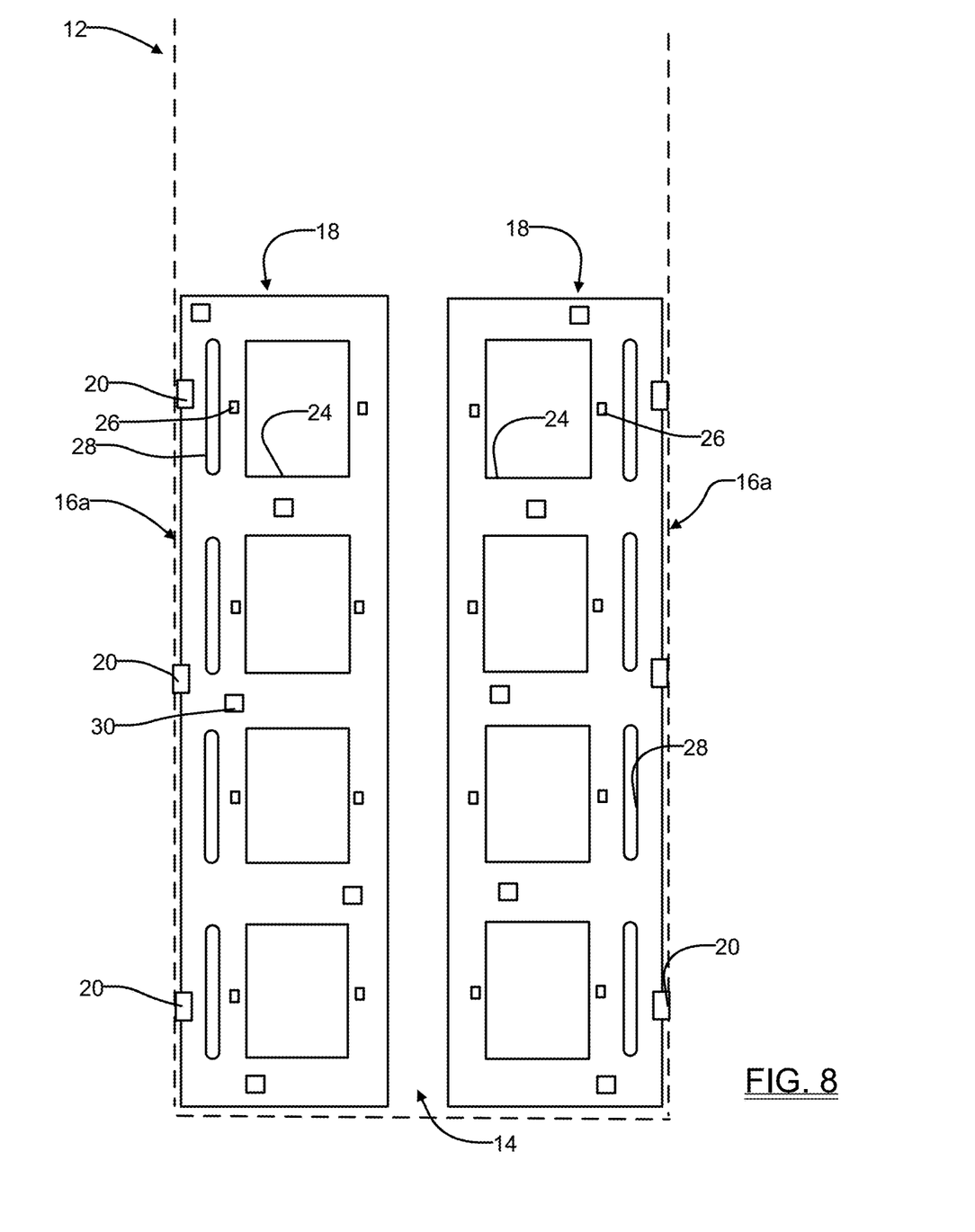
FIG. 8 is a front view of a pair of gate panels installed in a side-by-side configuration in the equipment cabinet, illustrating another configuration in which multiple ones of the gate panels may be employed to significantly expand the number of IT devices that may be supported in the rear area of the equipment cabinet.

Referring briefly to FIG. 8, two of the gate panels 18 are shown secured within the rear area 14 of the equipment rack 16. In this example the equipment rack 16 forms a 42 U equipment rack, and each one of the gate panels has a 21 U height (i.e., 36.75 inches; 93.34 cm) which spans 21 U shelf locations, or roughly half of the overall height of the equipment rack 12. In this implementation a total of eight IT devices 22 may be supported by the two gate panels 18. In this example the upper rear half of the equipment rack 16 is uncovered, but optionally two additional gate panels 18 could be secured above the two shown, providing a total of four gate panels 18, which would enable 16 IT devices 22 to be supported. Still further, different configurations of gate panels 18 could be employed, for example, one holding four IT devices 22 and the other holding only 2 IT devices. As another example, two gate panels 18 may be placed in a side-by-side arrangement, but staggered vertically from one another. Alternatively, one or both gate panels 18 may be centered within the equipment rack 16, rather than both being located in the upper half or the lower half. Still further, one or more of the gate panels 18 could be configured to hold a plurality of the IT devices 22 in a non-linear configuration (e.g., not a straight vertical arrangement, but instead where one or more of the IT devices are laterally staggered from the others). Combinations of all of the above-mentioned variations are also possible.

Since the gate panel 18 in this example covers only one half of the rear area 14 of the equipment rack 16, this enables easy reconfiguration of the gate panels in the event more (or fewer) IT devices 22 are needed at some point after the initial installation of the gate panels 18. For example, an initial installation may only involve the use of one gate panel 18 supporting four IT devices 22, but at a point in the future, the need for additional IT devices 22 arises. In such event, one or more additional gate panels 18 can be installed without the need to modify the initially installed gate panel 18 or its attachment within the equipment rack 12. The width of the gate panel 18 may be selected with the interior width of the equipment rack 12 in mind to enable two gate panels to be mounted in side-by-side fashion as shown in FIG. 8. Optionally, the width of the gate panel 18 may be selected such that a single gate panel 18 spans the entire width of the equipment rack 12 interior. It will also be appreciated that while the gate panel 18 is shown as having a 21 U height in FIGS. 1-3, this is intended to be just one example, and the gate panel could be dimensioned with a taller or shorter height. Potentially, the gate panel 18 may be custom dimensioned with a height sufficient to hold the number of devices that a customer specifies (i.e., a shorter gate panel 18 would be used to hold fewer devices, while a taller gate panel would be used to hold a larger number of devices).

Figure 9:
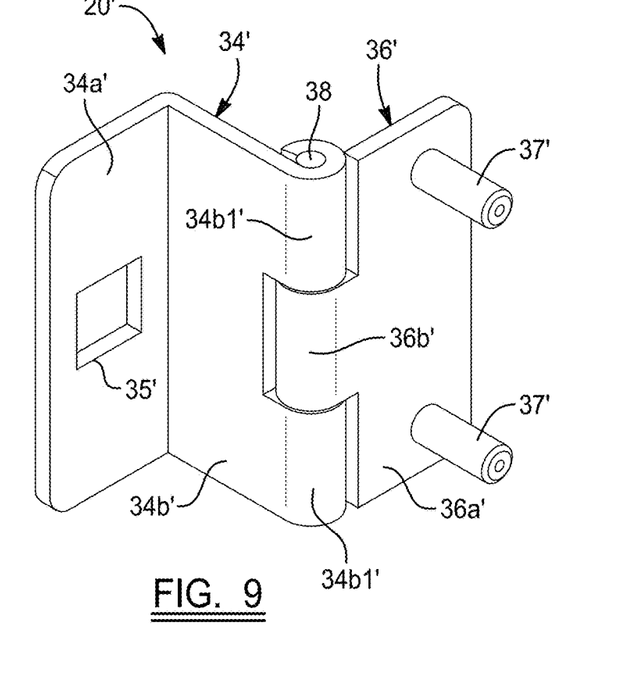
FIG. 9 is a perspective view of a hinge in accordance with another embodiment of the present disclosure, which is well suited for use with toolless fastening implements.
Figure 10:
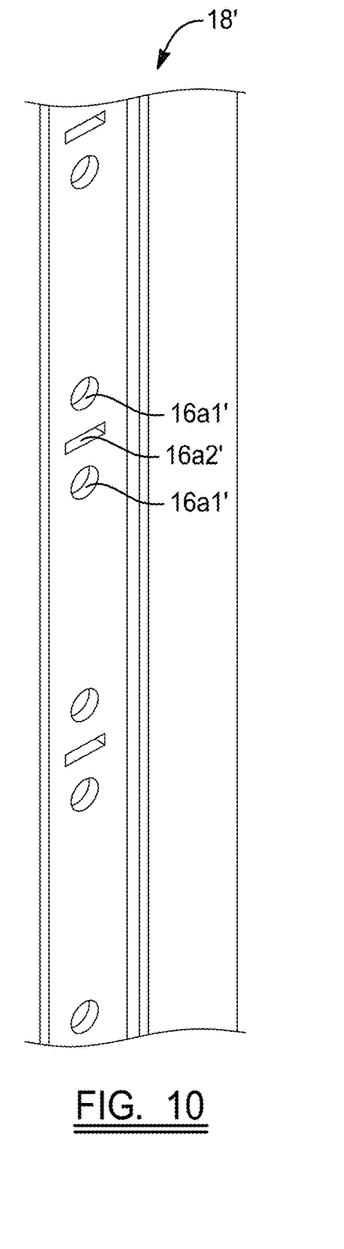
FIG. 10 is a perspective view of a portion of a gate panel in accordance with another embodiment of the present disclosure which is adapted for use with the hinge of FIG. 9.

Referring now to FIGS. 9 and 10, a hinge 20' and a gate panel 18' in accordance with another embodiment of the present disclosure are shown. The hinge 20' and gate panel 18' are similar in construction to the hinge 20 and the gate panel 18, and portions in common have been denoted in FIGS. 9 and 10 using the same reference numbers but with a "'" symbol.

The hinge 20' has an angled hinge plate 34' having a first portion 34a' and a second portion 34b', along with a flat hinge plate 36'. The first portion 34a', instead of having a vertical series of round holes, includes a vertical series of square shaped openings 35' which enable a commercially available toolless fastener to be used to secure the hinge 20' to an associated one of the vertical frame elements 16a at a desired vertical position. The second portion 34b' has pin receiving portions 34b1'. The flat hinge plate 36' has a flat portion 36a' and a hinge receiving portion 34b'. When the pin receiving portions 34b1' and the hinge receiving portion 36b' are axially aligned together, a hinge pin 38 is inserted through the portions 34b1'/36b' to couple the angled hinge plate 34' and the flat hinge plate 36' together for pivoting movement relative to one another. The flat hinge plate 36', instead of having a plurality of holes, includes one or more spaced apart threaded studs 37' projecting from the flat portion 36a'.

The gate panel 18' shown in FIG. 10 is substantially similar in construction to the gate panel 18, with the exception of a plurality of pairs of holes 16a1', with each pair of holes 16a1' being separated by a horizontal slot 16a2'. The horizontal slots 16a2' each form 1 U indices representing the 1 U shelf spacings within the equipment rack 12. The diameter of each one of the holes 16a1', as well as the spacing separating each pair of the holes 16a1' from one another, matches the diameter and spacing of the threaded studs 37'. This enables a pair of the threaded studs 37' to be inserted through a corresponding pair of the holes 16a1' when the hinge 20' is secured to the gate panel 18'.

Figure 11:
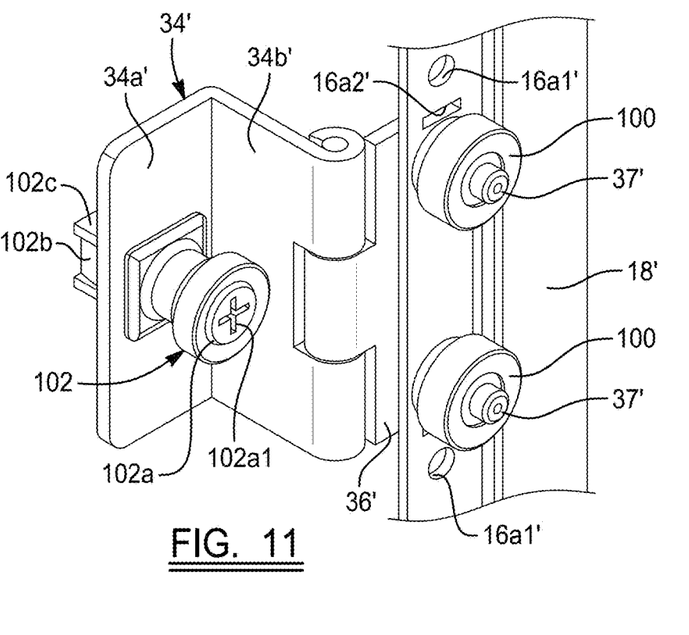
FIG. 11 is a perspective view of the hinge of FIG. 9 secured to a portion of the gate panel of FIG. 10 using commercially available threaded thumb wheel fasteners, and also illustrating a commercially available toolless fastener which is used to secure the hinge to one of the vertical frame elements of the equipment rack.

FIG. 11 shows the hinge 20' secured to the gate panel 18' using a pair of commercially available threaded thumb wheel fasteners 100. The thumb wheel fasteners 100 can be attached and tightened on the threaded studs 37' using the fingers of one hand. Thus, no external tools (e.g., wrenches, pliers, screw drivers, etc.) are needed to fasten the hinge 20' to the gate panel 18'.

FIG. 11 also shows a commercially available toolless fastener 102 secured to the first portion 34a' of the hinge 20'. In this example the toolless fastener 102 may be a DST captive fastener which is commercially available from DIRAK, Inc. of Manassas, VA; however the present disclosure is not limited to use with only one specific type of toolless fastener. It will be appreciated that with only minor modifications to the hinge 20' and/or the gate panel 18', other types of toolless fasteners may potentially be used. In this example the toolless fastener 102 is configured to snap in when mounting it to the first portion 34a' of the hinge 20'. The toolless fastener 102 includes a square shaped rear body portion 102c which engages within the square shaped opening 35' in the first portion 34a' of the hinge 20' to enable snap mounting the toolless fastener 102 to the hinge 20'. A rotatable thumb wheel 102a of the toolless fastener 102 can be grasped with the fingers of one hand and rotated in a first rotational direction to tighten a locking element 102b, to thus enable the toolless fastener 102 to be secured to a respective one of the vertical frame elements 16a. This is accomplished by positioning the rear body portion 102c of the toolless fastener 102 within one of the square shaped holes 16a1 in the respective one of the vertical frame elements 16a, and then turning the rotatable thumb wheel 102a in the first rotational direction. The locking element 102b will then be moved into engagement against a surface of the respective one of the vertical frame elements 16a such that the locking element 102b clamps the first portion 34a' of the hinge 20' to the respective vertical frame element 16a once the thumb wheel 102a is fully tightened. The rotatable thumb wheel 102a can be rotated in the opposite rotational direction to enable releasing and removing the toolless fastener 102 from the respective vertical frame element 16a. In this example the thumb wheel 102a also includes a Phillips screw 102a1 which enables a conventional Phillips screwdriver to optionally be used to tighten and/or remove the toolless fastener 102.

Figure 12:
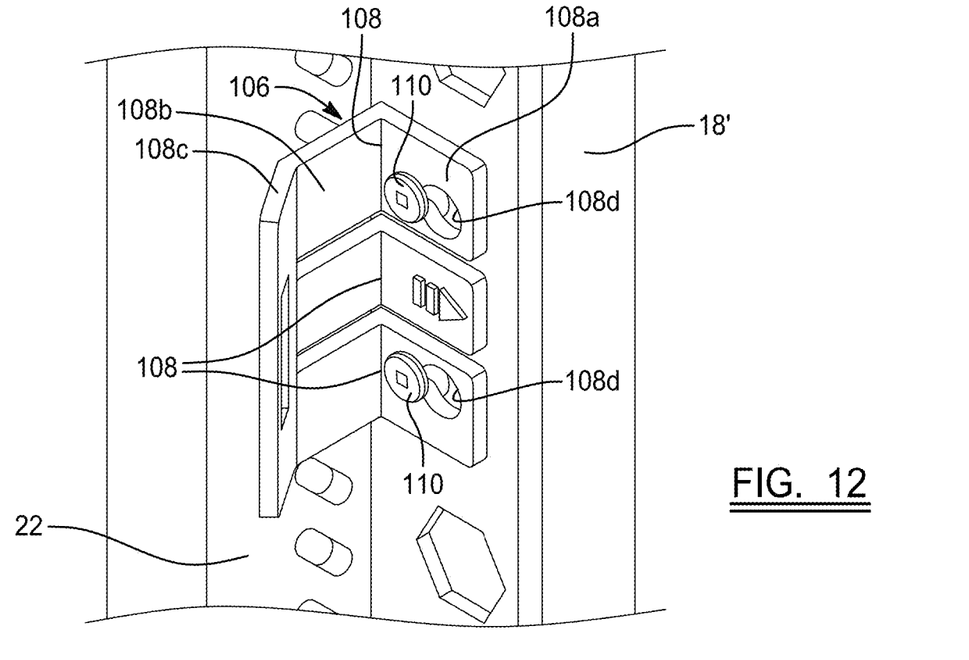
FIG. 12 is an enlarged perspective view of a toolless snap latch in accordance with one embodiment of the present invention, which is mounted to the gate panel and used to secure an external device to the gate panel without the need for any external fasteners.
Figure 13:
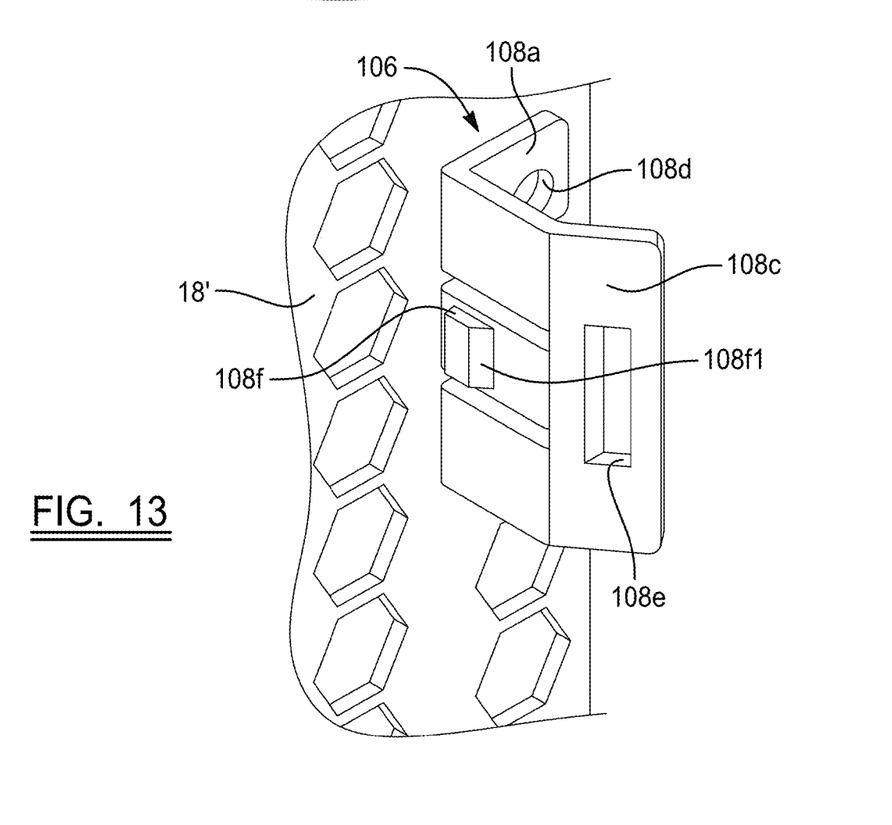
FIG. 13 is a perspective view of the toolless snap latch of FIG. 12 but from a direction opposite to that shown in FIG. 12, illustrating a protrusion on the toolless snap latch which engages a recess or opening in a housing of an external device to assist in securing the external device to the gate panel.

Referring now to FIGS. 12 and 13, a toolless snap latch 106 is shown in accordance with the present disclosure for releasably securing the IT devices 22 to the gate panel 18'. By "releasably securing" it is meant securing the IT devices in a secure, stable manner on the gate panel 18' without the need for external hand tools (e.g., screwdrivers, pliers, etc.) or complex and/or inconvenient attachment/removal procedures. As will be explained in the following paragraphs, the toolless snap latches 106 enable secure, quick and easy mounting of the IT devices 22 on the gate panel 18' simply by positioning the opposing lateral sides of each IT device between a pair of the toolless latches 106, and pressing the IT device towards the gate panel 18'. Removal can be accomplished simply by grasping the opposing lateral sides of the IT device 22 and pulling the IT device gently but firmly outwardly away from the gate panel 18' while pressing outwardly on portions of the toolless snap latches 106, for example with the thumb of each hand. Optionally, the toolless latches 106 could be mounted to engage the vertically opposing edges of the housing of the IT device 22 as well, with only minor modifications to the housing of the IT device.

As shown in FIGS. 12 and 13, the toolless latch 106 includes at least two flexible arms 108, and in this example three flexible arms 108. Each flexible arm 108 includes a base portion 108*a* and an intermediate portion 108*b*. The intermediate portions 108*b* all terminate at a flared outer portion 108*c*. The upper and lower arms 108 each further include a key-shaped opening 108*d*. The key-shaped openings 108*d* can be positioned over a pair of fixedly mounted, mushroom-like studs 110, which are permanently mounted in the gate panel 18' during its manufacture (i.e., either by a press fit, or by being molded in place, or by any other suitable means). In one example the mushroom-like studs 110 are commercially available PEM® style fasteners available from PennEngineering of Danboro, PA. However, it will be appreciated that other types of stud-like fasteners could be used, and the present disclosure is not limited to use with any one specific style of stud-like fastener.

The mushroom-like studs 110 are positioned on the gate panel 18' with a predetermined spacing during manufacture of the gate panel. The predetermined spacing is in accordance with the spacing of enlarged portions of the key-shaped openings 108*d*. Once the enlarged portions of the key-shaped openings 108*d* are positioned over of the mushroom-like studs 110 and the toolless snap latch 106 pressed against the surface of the gate panel 18', the entire toolless snap latch can be slid laterally a short amount, at which point smaller opening sections of the key-shaped openings 108*d* will tightly engage their corresponding mushroom-like studs 110, as is well understood with mating keyhole/stud fastening components. As such, no external fasteners (e.g., threaded bolts) or external tools are needed to secure the toolless snap latches 106 to the gate panel 18'.

With further reference to FIG. 13, the flared outer portion 108*c* can be seen to include an elongated slot 108*e*, and the central arm 108 can be seen to include a protrusion 108*f* having a ramp portion 108*f*1. The dimensions of the protrusion 108*f* and its shape may be chosen in accordance with the dimensions and shape of a recess or opening on the lateral side portions of the housing of the IT device 22. In this manner, when the IT device 22 is positioned between a laterally spaced apart pair of the toolless snap latches 106 and then pressed towards the gate panel 18' during installation, the arms 108 of the toolless snap latches 106 flex outwardly slightly, and the protrusion 108*f* will be captured in the recess or opening in the IT device 22 housing. The ramp portion 108*f*1 also helps to momentarily flex the arms 108 of the pair of toolless snap latches 106 away from one another during mounting of the IT device 22 before the protrusion 108*f* fully engages in the recess or opening in the IT device housing. The elongated slots 108*e* in the flared outer portions 108*c* of the toolless snap latches 106 may be grasped and pressed outwardly away from one another to help momentarily disengage the protrusions 108*f* from the recess or opening in the IT device 22 housing during removal of the IT device. As such, removal of the IT device 22 from the gate panel 18' can also be accomplished without the need for any external hand tools.

Figure 14:
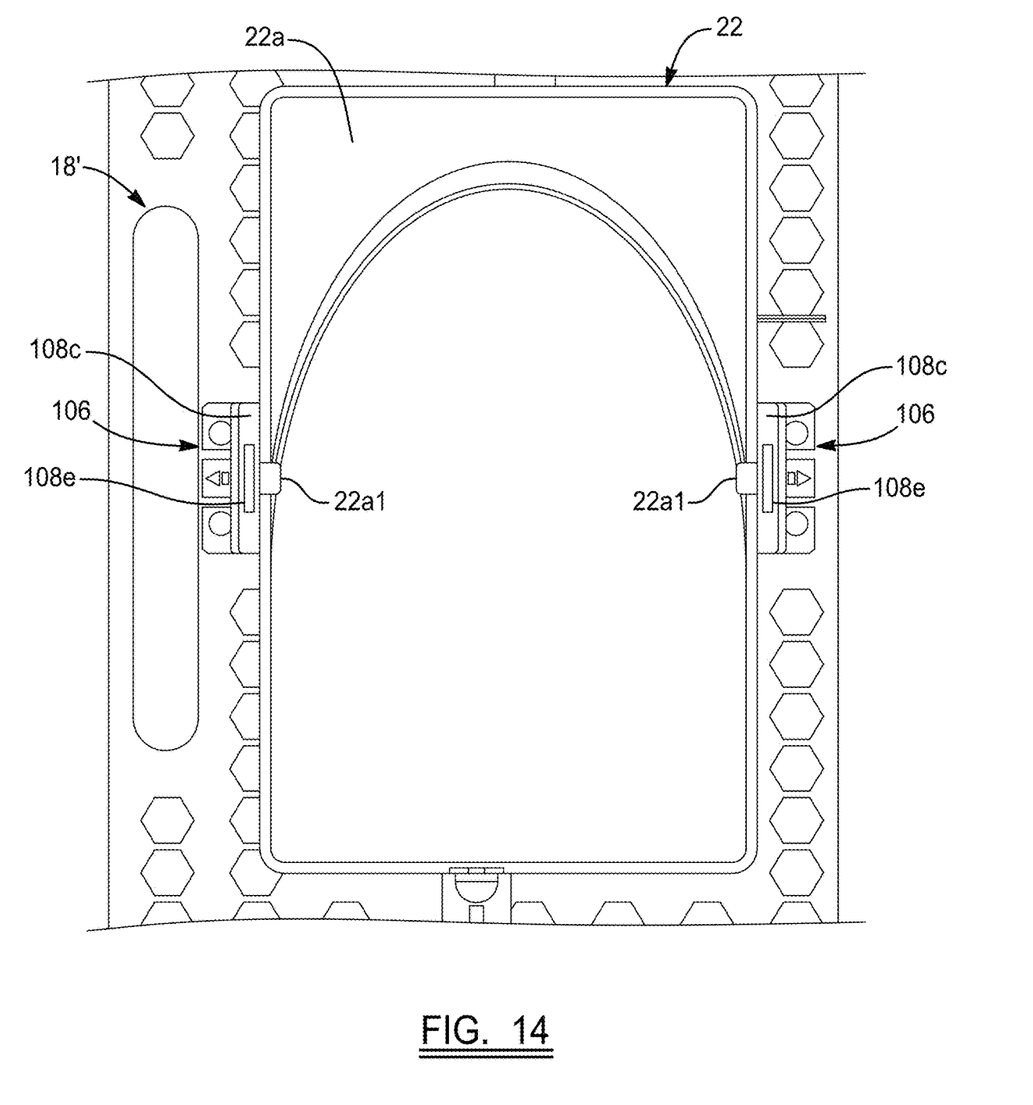
FIG. 14 is a plan view of a pair of the toolless snap latches being used to releasably, yet securely, mount an external device on the gate panel using a friction fit, and without the use of any external tools.

With brief reference to FIG. 14, the mounting of one of the IT devices 22 to the gate panel 18' using a pair of the toolless latches 106 is shown. Dashed boxes 22*a*1 represent recesses or openings in the lateral sides of a housing 22*a* of the IT device 22. The recesses or openings 22*a*1 receive the protrusions 108*f* when the IT device 22 is mounted to the gate panel 18'.

The mounting platform 10 forms a system which significantly expands on the use of an equipment rack by enabling the rack to support an additional quantity of components in its rear area, without requiring modification of the basic layout of the equipment rack, without interfering with mounting or access to those components mounted at the 1 U shelf locations of the cabinet, and without significantly interfering with the passage of airflow through the rack. The gate panels 18 and 18' of the mounting platform 10 may be viewed as having a modular quality, as additional ones of the gate panels 18 or 18' may be installed at a later date in a given equipment rack without interfering with previously installed gate panels. Perhaps most importantly, the mounting platform 10 does not enlarge the footprint of the equipment rack or add significantly to its weight, and serves to free up 1 U shelf locations for other revenue-generating components that would otherwise need to be occupied by the IT devices 22.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A mounting platform for use in an equipment rack having a frame with a pair of spaced apart vertical frame elements, the mounting platform adapted to support at least one external device adjacent a rear area of the equipment rack without interfering with use of internal device mounting locations within the equipment rack, the mounting platform comprising:
    a gate panel configured to support the at least one external device thereon; and
    a hinge having a first portion and a second portion, and a pin coupling the first and second portions for pivotal movement relative to each other, the second portion being coupled to the gate panel and the first portion being directly coupled to a respective one of the vertical frame elements;
    the first portion of the hinge forming an angled hinge plate that offsets the gate panel rearwardly away from the vertical frame elements by a predetermined amount to provide additional clearance for independent components being supported inside the equipment, and the angled hinge plate having a plurality of holes enabling adjustable positioning at a plurality of different vertical locations on the respective one of the vertical frame elements; and
    the hinge being further configured to support the gate panel in a vertical orientation from the respective one of the vertical frame elements, and to enable movement of the gate panel between:
        a closed position in which the gate panel is positioned parallel to a line extending between the vertical frame elements, but spaced rearwardly of the vertical frame elements, and supports the at least one external device adjacent to the rear area of the equipment rack, and
        an open position in which the gate panel is positioned substantially perpendicular to the line extending between the vertical frame elements, and does not impede access to the internal device mounting locations within the equipment rack.

2. The mounting platform of claim 1, wherein the angled hinge plate positions the second portion in non-coplanar alignment with the first portion when the hinge is in the closed position.

3. The mounting platform of claim 1, wherein the second portion includes a plurality of holes and a corresponding plurality of internally threaded bosses projecting outwardly from the holes on one surface of the second portion, the bosses adapted to engage with holes in the gate panel when the hinge is secured to the gate panel.

4. The mounting platform of claim 1, wherein the hinge includes a plurality of slots for facilitating attachment to a respective one of the vertical frame elements using external fasteners.

5. The mounting platform of claim 1, wherein the gate panel includes at least one device opening having dimensions to enable at least one of partial insertion or full insertion of the external device therein when the external device is mounted on the gate panel.

6. The mounting platform of claim 1, wherein the external device comprises an information technology (IT) device.

7. The mounting platform of claim 1, wherein the gate panel includes at least one cable opening for allowing a cable to pass therethrough.

8. The mounting platform of claim 1, wherein the gate panel includes a plurality of airflow openings for allowing airflow through the gate panel.

9. The mounting platform of claim 1, wherein the gate panel includes a plurality of securing openings configured to accept external fasteners to assist in mounting the external device to the gate panel.

10. The mounting platform of claim 1, further comprising a toolless fastener adapted to be secured to the first portion of the hinge, for enabling securing the first portion of the hinge to the respective one of the vertical frame elements without the need for an external tool.

11. The mounting platform of claim 10, wherein the toolless fastener includes a manually engageable thumb wheel and a locking component engaged therewith, the locking component assisting in clamping the first portion of the hinge to a respective one of the vertical frame elements.

12. The mounting platform of claim 1, wherein the hinge includes a pair of threaded studs projecting from the second portion; and
    wherein the mounting platform further includes a pair of rotatable thumb wheels for engaging the threaded studs and securing the second portion of the hinge to the gate panel without a need for use of an external tool.

13. The mounting platform of claim 1, further comprising a pair of toolless snap latches adapted to be secured to the gate panel, and operable to engage portions of a housing of the external device to support the external device on the gate panel.

14. The mounting platform of claim 13, further comprising a plurality of mushroom-like studs fixedly secured to the gate panel; and
    wherein each one of the toolless snap latches includes at least one keyhole-like opening adapted to engage with one of the mushroom-like studs, to enable mounting of the toolless snap latches on the gate panel without a need for an external tool.

15. The mounting platform of claim 14, wherein each one of the toolless snap latches includes:
    a plurality of flexible arms;
    each one of the plurality of flexible arms including a base portion and an intermediate portion extending from the base portion; and
    the plurality of flexible arms terminating in a flared outer portion, the flared outer portion operable to facilitate flexing the plurality of flexible arms during at least one of mounting or removal of the external device to or from the gate panel.

16. The mounting platform of claim 15, wherein the base portion of at least one of the plurality of flexible arms includes the at least one keyhole-shaped opening.

17. The mounting platform of claim 16, wherein the base portions of two ones of the plurality of flexible arms include separate ones of the keyhole-shaped opening.

18. The mounting platform of claim 15, wherein at least one of the plurality of flexible arms includes a protrusion projecting from its respective said intermediate portion for engaging with a portion of a housing of the external device to assist in securing the external device to the gate panel.

19. A mounting platform for use in an equipment rack having a frame with a pair of spaced apart vertical frame elements, the mounting platform adapted to support at least one external device adjacent a rear area of the equipment rack without interfering with use of internal device mounting locations within the equipment rack, the mounting platform comprising:
    a gate panel configured to support the at least one external device thereon; and
    first and second hinges;
    each one of the first and second hinges having:
        a first portion and a second portion; and
        a pin coupling the first and second portions for pivotal movement relative to each other, the second portion being coupled to the gate panel and the first portion being coupled to a respective one of the vertical frame elements;
    first and second pairs of mushroom-like studs secured to the gate panel and in accordance with a spacing larger than a lateral dimension of the external device;
    a pair of toolless snap latches each having a plurality of keyhole-like openings for engaging with a respective one of the first or second pairs of mushroom-like studs, to enable the toolless snap latches to be secured to the gate panel without the need for an external tool;
    the toolless snap latches further configured to enable mounting of the external device to the gate panel, and removal of the external device form the gate panel, without the need for a hand tool;
    the first and second hinges being further configured to support the gate panel in a vertical orientation from the respective one of the vertical frame elements, and to enable movement of the gate panel between:
        a closed position in which the gate panel is positioned parallel to a line extending between the vertical frame elements and supports the at least one external device adjacent to the rear area of the equipment rack, and
        an open position in which the gate panel is positioned substantially perpendicular to the line extending between the vertical frame elements, and does not impede access to the internal device mounting locations within the equipment rack.

20. A method for supporting at least one external device adjacent a rear area of an equipment rack without interfering with use of internal device mounting locations within the equipment rack, wherein the equipment rack has a pair of spaced apart vertical frame elements forming a portion of a frame of the equipment rack, the method comprising:
    securing a first portion of a hinge directly to an associated one of the vertical frame elements, and securing a second portion of the hinge to a gate panel to support the gate panel parallel to the pair of spaced apart vertical frame elements, the first portion of the hinge forming an angled hinge plate that offsets the gate panel rearwardly away from the pair of vertical frame elements by a predetermined amount to provide additional clearance for independent components being supported inside the equipment, and the angled hinge plate having a plurality of holes enabling adjustable positioning at a plurality of different vertical locations on the respective one of the vertical frame elements; and
    pivotally supporting the gate panel in a vertical orientation from the associated one of the vertical frame elements such that the gate panel:
        is movable into a closed position arranged parallel to a line extending between the vertical frame elements, and such that the gate panel is positioned at the rear area of the equipment rack adjacent the internal device mounting locations, but without impeding use of the internal device mounting locations; and
        is movable into an open position arranged perpendicular to the line extending between the vertical frame elements and spaced away from the internal device mounting locations, permitting unimpeded access to an interior area of the equipment rack; and
    using the gate panel to removably support thereon the at least one external device.

21. A mounting platform for use in an equipment rack having a frame with a pair of spaced apart vertical frame elements, the mounting platform adapted to support at least one external device adjacent a rear area of the equipment rack without interfering with use of internal device mounting locations within the equipment rack, the mounting platform comprising:
    a gate panel configured to support the at least one external device thereon; and
    a hinge having a first portion and a second portion, and a pin coupling the first and second portions for pivotal movement relative to each other, the second portion being coupled to the gate panel and the first portion being coupled to a respective one of the vertical frame elements; and the hinge being further configured to support the gate panel in a vertical orientation from the respective one of the vertical frame elements, and to enable movement of the gate panel between:

a closed position in which the gate panel is positioned parallel to a line extending between the vertical frame elements, but spaced rearwardly of the vertical frame elements, and supports the at least one external device adjacent to the rear area of the equipment rack, and an open position in which the gate panel is positioned substantially perpendicular to the line extending between the vertical frame elements, and does not impede access to the internal device mounting locations within the equipment rack; and wherein the second portion includes a plurality of holes and a corresponding plurality of internally threaded bosses projecting outwardly from the holes on one surface of the second portion, the bosses adapted to engage with holes in the gate panel when the hinge is secured to the gate panel.

* * * * *